United States Patent [19]

Obikane et al.

[11] Patent Number: 4,950,982
[45] Date of Patent: Aug. 21, 1990

[54] ELECTRIC PROBING TEST MACHINE

[75] Inventors: Tadashi Obikane, Kofu; Hisashi Koike, Yamanashi; Sumi Tanaka, Kofu, all of Japan

[73] Assignee: Tokyo Electron Limited, Tokyo, Japan

[21] Appl. No.: 471,696

[22] Filed: Jan. 26, 1990

Related U.S. Application Data

[63] Continuation of Ser. No. 278,246, Nov. 30, 1988, now abandoned.

[30] Foreign Application Priority Data

Nov. 30, 1987 [JP] Japan .................. 62-303761

[51] Int. Cl.$^5$ .................. G01R 31/22; B65G 47/24
[52] U.S. Cl. .................. 324/158 F; 324/158 P; 324/158 R; 198/394; 198/395
[58] Field of Search ............ 324/158 R, 158 F, 158 P; 384/18; 198/394, 395; 312/339, 340; 414/924, 788-789

[56] References Cited

U.S. PATENT DOCUMENTS

| | | | |
|---|---|---|---|
| 3,408,565 | 10/1968 | Frick et al. | 324/158 F |
| 3,488,097 | 1/1970 | Fall | 312/340 |
| 4,067,632 | 1/1978 | Sekerich | 312/339 |
| 4,103,232 | 7/1978 | Sugita et al. | 324/158 F |
| 4,662,761 | 5/1987 | Hoffman | 312/339 |
| 4,760,924 | 8/1988 | Sato et al. | 324/158 F |
| 4,786,867 | 11/1988 | Yamatsu | 324/158 F |
| 4,807,152 | 2/1989 | Lane et al. | 364/513 |
| 4,899,105 | 2/1990 | Akiyama | 324/158 R |
| 4,901,011 | 2/1990 | Koike et al. | 324/158 F |

Primary Examiner—Reinhard J. Eisenzopf
Assistant Examiner—Vinh P. Nguyen
Attorney, Agent, or Firm—Oblon, Spivak, McClelland, Maier & Neustadt

[57] ABSTRACT

An electric probing test machine including a test stage unit which is constructed as an independent component of at least one system and used to test the electrical characteristics of a wafer by having the wafer on the stage contacted by a multitude of probes and a loading-/unloading unit which is constructed as an independent component of at least one system and used to bring a wafer from a wafer cassette to the stage of the test stage unit or from the stage of the test stage unit to the wafer cassette. The loading/unloading unit is combined with the test stage unit in such a way that the loading/unloading unit can be separated and moved away from the test stage unit.

3 Claims, 4 Drawing Sheets

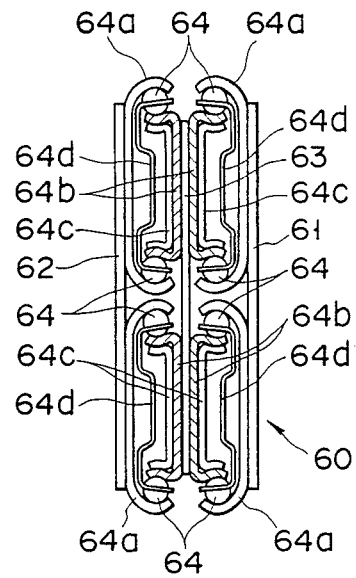
F I G. 5
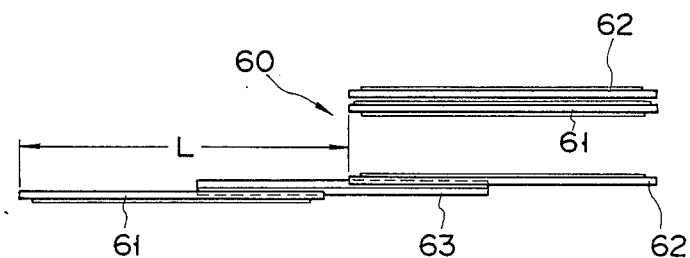
F I G. 6

ELECTRIC PROBING TEST MACHINE

This application is a continuation of application Ser. No. 278,246, filed on Nov. 30, 1988, now abandoned.

BACKGROUND OF THE INVENTION

1. Field of the Invention

This invention relates to a probing test machine for testing the electrical characteristics of semiconductor wafers, liquid crystal display elements, printed circuit boards and so forth and more particularly to an electric probing test machine constructed such that the loading-/unloading unit can be separated from the test stage unit.

2. Description of the Related Art

Semiconductor devices such as ICc and LSIs, LCD elements and printed circuit boards are subjected to several tests in the manufacturing process to evaluate their electrical characteristics.

As an example, in a wafer test in which continuity is tested on a circuit of a device pattern formed on a semiconductor wafer, the probes of a wafer probing machine are brought into contact with the electrodes of the device pattern and a high frequency current is passed through the probes to the circuit to measure the electrical characteristics of that device pattern.

Wafer probing machines used for wafer testing are illustrated in Japanese Utility Model Disclosure No. 85-41045 and Japanese Patent Disclosure No. 86-168236. These machines are of the so-called one-loader, one-stage type which has one test stage unit for one loading/unloading unit.

Japanese Patent Disclosure No. 86-168236 also discloses the so-called one-loader, multi-stage type wafer probing machine in which one loading/unloading unit is used commonly for a plurality of test stage units.

In those wafer probing machines, the test stage unit is used to test the electrical characteristics of a semiconductor wafer on the test stage and the loading/unloading unit transfers semiconductor wafers between a wafer cassette and the test stage.

A large number of wires are installed in both the test stage unit and the loading/unloading unit. Therefore, maintaining those units, which includes changing the wiring, takes a long time. In order to reduce maintenance time, those units are constructed as independent components, thereby making maintenance work easier.

Meanwhile, in a conventional one-loader, multistage type wafer probing machine, for example a one-loader two-stage type machine, there are two loading/unloading units on the lateral sides of the test stage unit. Therefore, the working space is very small and it is difficult and time-consuming to maintain the test stage unit and the loading/unloading unit.

In adjusting the internal mechanism of the loading-/unloading unit for example, the working space is limited to the front side of the loading/unloading unit. Therefore, when the part to be maintained is positioned at the lateral side of the test stage unit, the operator cannot reach that part since the loading/unloading unit is in his way.

Also with a one-loader, one-stage type probing machine, in maintaining the test stage unit, the working space for maintenance is significantly limited by the loading/unloading unit. This makes it difficult to adjust the mechanisms at the mutually adjoining faces of the test stage unit and the loading/unloading unit.

SUMMARY OF THE INVENTION

The object of this invention is to provide an electric probing test machine which can be maintained easily by substantially eliminating unmaintainable parts.

According to an aspect of the present invention, the electric probing test machine comprises a test stage unit constructed as an independent component of at least one system and used for testing the electrical characteristics of an object under test by having the object on the stage contacted by a multitude of probes and a loading-/unloading unit constructed as an independent component of at least one system and used to bring the object under test from a specified storing place to the test stage unit or from the test stage unit to the specified storing place, said loading/unloading unit being combined with the test stage unit such that the loading/unloading unit can be separated and moved away from the test stage unit.

The electric probing machine according to this invention may be applied to wafer probing machines and liquid crystal display (LCD) element probing machines.

It is desirable to install a test stage unit on either side of the above-described loading/unloading unit and also sliding means to enable only the loading/unloading unit to be drawn out in the front direction, namely, a one-loader, two-stage type probing machine comprising a couple of test stage units and a loading/unloading unit placed in between. Sufficiently long power connection and air vacuum cables need to be provided for this loading/unloading unit.

In the above probing machine, a sufficient working space can be obtained between the two test stage units when the loading/unloading unit is separated from the test stage units.

Preferably, the above loading/unloading unit comprises means for transferring a semiconductor wafer between a wafer cassette and the test stage and pre-aligning means for a wafer before the wafer is transferred from the wafer cassette to the test stage, and the transfer means and the pre-aligning means are installed on a movable base and the movable base can be moved in the forward direction of the unit.

It is also desirable that a caster is attached to the bottom of the front-side member of the movable base so that the loading/unloading unit can be moved.

The sliding means of the loading/unloading unit should preferably be composed of ball guides and rails. Roller guides may be used instead of ball guides.

The power connection cables of the loading/unloading unit should preferably be in a coiled or foldable form and able to be stretched when in use. It is possible to connect interconnecting cables or extension cables.

BRIEF DESCRIPTION OF THE DRAWINGS

FIG. 5 is a transverse cross section showing the slide rail of the loading/unloading unit; and FIG. 6 is a side view to explain the moving stroke of the slide rail as seen from its lateral side.

DETAILED DESCRIPTION OF THE PREFERRED EMBODIMENTS

Various embodiments of this invention will now be described with reference to the accompanying drawings.

Figure 1:
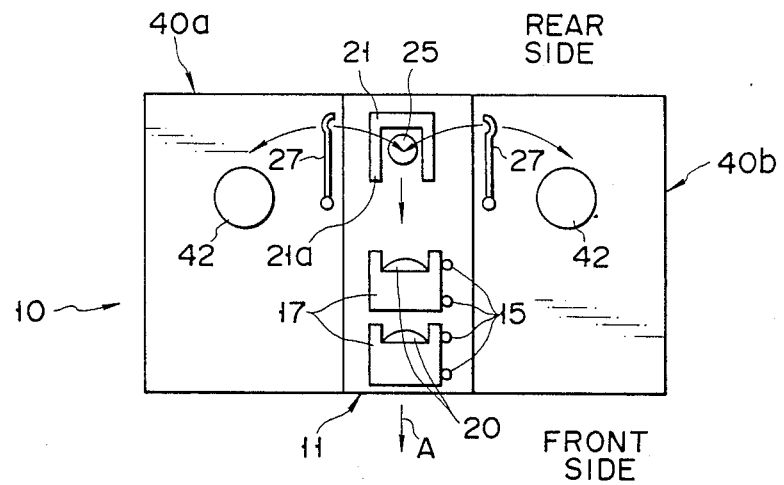
FIG. 1 is a plan view schematically showing a one-loader, two-stage type probing test machine according to an embodiment of this invention.

As shown in FIG. 1, wafer probing machine 10 is composed of loading/unloading unit 11 of one system and test stage units 40a and 40b — unit boxes of two systems. Loading/unloading unit 11 is a transportable modular unit. When loading/unloading unit 11 is used, it is brought into the space between first and second test stage units 40a and 40b. When loading/unloading unit 11 is to be maintained, it is taken out of its installed position between test stage units 40a and 40b.

Four guide shafts 15 are disposed to the front side of loading/unloading unit 11 and two wafer cassettes are moved along guide shafts 15 for bringing them in and out. Vacuum chucking tweezers 21 are mounted to the rear side of loading/unloading unit 11 and are capable of taking wafers 20 from cassettes 17 onto pre-alignment stage 25.

Figure 2:
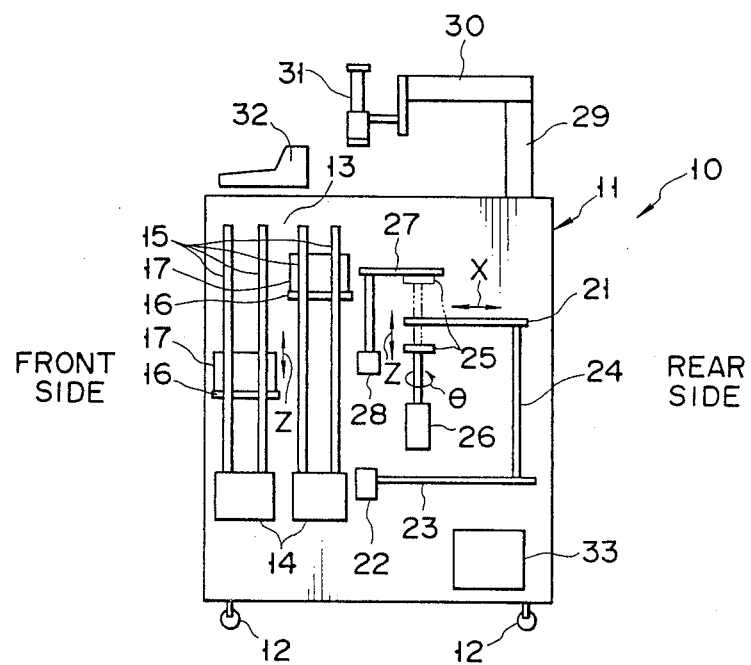
FIG. 2 is a view schematically showing the internal mechanism of the loading/unloading unit, as seen from its lateral side, of the probing machine of the embodiment of this invention.

Test stage units 40a and 40b each have handling arm 27 and test stage 42. As shown in FIG. 2, arms 27, connected to motors 28, can rotate 360° in a horizontal plane. Column 29 is mounted upright to the rear side on the top surface of the housing of loading/unloading unit 11. Arm 30 is attached to column 29 in such a way that it can rotate 360° in a horizontal plane around column 29. Microscope 31 to enlarge the image of the chips (device patterns) for observation, which is attached to the end of arm 30, can move up and down.

Cassette-receiving space 13 is provided in the front-side area in loading/unloading unit 11. Provided in this cassette-receiving space 13 are four guide shafts 15 which are installed upright and driven by motors 14 respectively, and two loading tables 16 which are moved in a vertical direction along two guide shafts 15. Loading tables 16 receive cassette 17 thereon. One cassette 17 accommodates 25 wafers 20.

Vacuum chucking tweezers 21 are connected through vertical support rod 24 to horizontal rotating shaft 23. Horizontal rotating shaft 23 is in turn connected to motor 22. The vacuum chucking tweezers 21 so constructed are capable of sliding in parallel with the X-axis direction. Tweezers 21 have at their ends formed chucking section 21a in a U-like configuration. Chucking section 21a connects with a vacuum pump (not shown).

Pre-alignment stage 25 has at its top surface a vacuum chucking device (not shown) to hold wafer 20 securely. The positioning mechanism of pre-alignment stage 25 comprises motor 26, a ball screw and a timing belt, so that as pre-alignment stage 25 rises in the Z axis direction, the $\theta$ axis rotates. A light-emitting/receiving sensor (not shown) is installed near pre-alignment stage 25 to detect if wafer 20 on stage 25 is positioned correctly.

Keyboard 32, placed on the top of loading/unloading unit 11, is connected to the input part of CPU (not shown). Receiving various kinds of information from the sensor (not shown), the CPU controls the motion of loading/unloading unit 11. Power supply 33, provided at the bottom area of unit 11 supplies power to first and second test stage units 40a, 40b.

First and second test stage units 40a and 40b will be described in the following. Since the first and second test stage units are substantially identical in mechanism, description is made only of first test stage unit 40a.

First test stage unit 40a is an independent housing 100 mm deep, 620 mm wide and 1200 mm high. The housing has casters 12 attached at four corners of its bottom face. Casters 12 are each provided with a stopper assembly (not shown). As an example, the stopper assembly may be a type which uses a screw and a nut to adjust the height of the caster and fix it when the unit has been transferred to the specified position.

First test stage unit 40a has bolt mounting/dismounting means (not shown) fitted at eight locations on either side to permit loading/unloading unit 11 to be joined therewith on either side, said eight locations being the four corners and the mid-points of the four sides of one side face of the housing of first test stage unit 40a.

Test stage unit 40a includes a plurality of drive mechanisms (not shown) to drive test stage 42 in the four axis directions — the X axis, Y axis, Z axis and $\theta$ axis. Test stage unit 40a is capable of moving test stage 42 symmetrically in relation to the center position of first test stage unit 40a within the driving ranges in the X-axis and Y-axis directions.

Test stage unit 40a can perform fine alignment of a wafer. For example, a wafer is aligned correctly by the use of an image sensor which picks up an image of the scribed line or test chip pattern on the wafer to which laser light is radiated.

A probe card (not shown) is placed against test stage 42. The probe card has a multitude of probes and as test stage 42 is made to rise, the probes come into contact with the electrodes of the wafer chip.

Handling arms 27 mentioned above may be provided in pairs (each pair being a combination of an upper and a lower arm) to bring tested wafer 20 from test stage 42 to pre-alignment stage 25 and new wafer 20 from prealignment stage 25 to test stage 42. This will greatly improve the efficiency of wafer transfer.

Referring now to FIGS. 3 through 6, the slide mechanism of loading/unloading unit 11 will be described.

Figure 3:
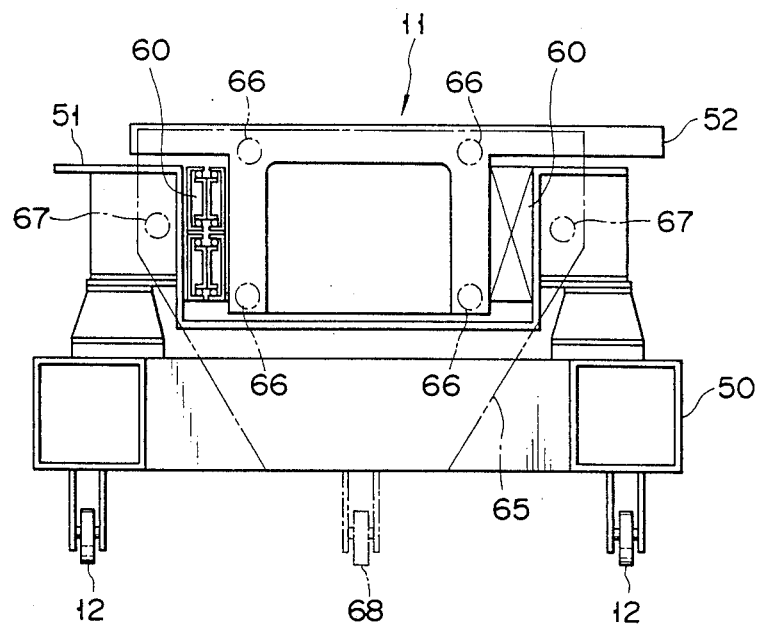
FIG. 3 is a front view to explain the moving mechanism of the loading/unloading unit, as seen from the front side, of/the probing machine of the embodiment of this invention.

As illustrated in FIG. 3, stationary base 51 is fixed to outside support frame 50 for loading/unloading unit 11 and movable base 52 can slide by means of slide rails 60 from the rear side of the probing machine to the front side.

Movable base 52 is made of cast, for example, and supports wafer cassettes 17, vacuum chucking tweezers 21 and pre-alignment stage 25.

Referring to FIG. 5, slide rail 60 is composed of movable-side plate 61, stationary-side plate 62, middle plate 63 and ball guides holding balls 64.

Movable-side plates 61 are fixed to either side of movable base 52 mentioned above and has ball guides holding balls 64, in two stages. Stationary-side plates 62 are constructed exactly the same way as movable-side plates 61.

Stationary-side plates 62 are fixed to the inside walls of stationary base 51. Outer guide members 64a of the ball guides are fixed to the inside faces of movable-side plates 61 and stationary-side plates 62.

Middle plates 63 are located between movable-side plates 61 and stationary-side plates 62. Inner guide members 64b of the respective ball guides are fixed to the both sides of middle plates 63.

Inner guide members 64b are reinforced by stiffening members 64c, attached from inside.

Balls 64 are held by holding members 64d. While held by holding members 64d, balls 64 roll within the gaps between inner and outer guide members 64a and 64b.

Referring to FIG. 6, the releasing mechanism of loading/unloading unit 11 will be described.

At slide rails 60, middle plates 63 can slide with respect to stationary-side plates 62 and movable-side plates 61 can slide with respect to middle plates 63, both by the use of balls 64. When loading/unloading unit 11 is drawn out, the maximum movement stroke is L as indicated in FIG. 6.

Figure 4:
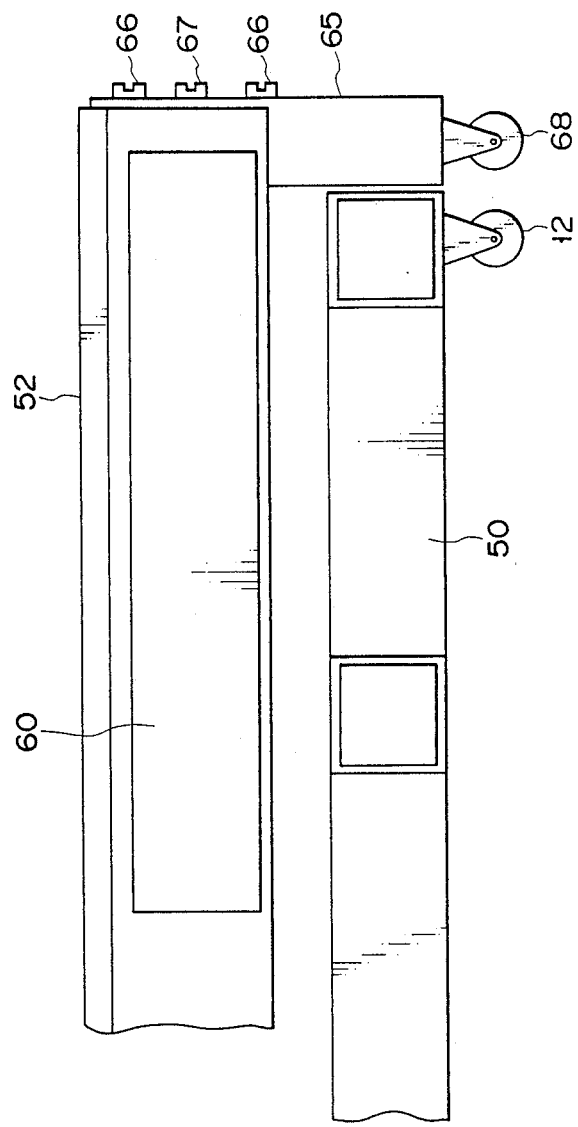
FIG. 4 is a partial side view to explain the moving mechanism of the loading/unloading unit, as seen from its lateral side.

The length in the depth direction of the loading/unloading unit is about 1000 mm and the movement stroke is about 740 mm. When shortest slide rails 60 are used, the movement stroke is about 710 mm. As shown in FIG. 4, slide rails 60 are installed shifted a little to the front side of the probing machine in order to securely support movable base 52 and other members which all together amount to a considerable weight.

Fixed plate 65 is fixed to the front side of movable base 52 with four bolts 66. When bringing loading/unloading unit 11 back to the return position from the released state, fixed plate 66 contacts the front face of stationary base 51 to stop the movement of the unit.

Fixed plate 65 is fixed to the front face of stationary base 51 with bolts 67 except when loading/unloading unit 11 is released to maintain test stage units 40a and 40b.

When loading/unloading unit 11 is drawn out in the arrow direction A in FIG. 1, caster 68 at the bottom end of fixed plate 65 rolls on the floor. Therefore, the front side of loading/unloading unit 11 is supported by caster 68. This prevents released unit 11 from overhanging which would occur when the unit is supported only by guide rails 60.

Loading/unloading unit 11 is connected to first and second test stage units 40a and 40b through power cables and vacuum pipes (not shown). Therefore, it is necessary to connect extension cables or pipes or store the cables and pipes folded or in spiral expandable form.

Maintenance of the wafer probing machine according to the embodiment of this invention will be described in great detail in the following.

Wafer probing machines of this kind need to be maintained whether periodically or not. Various types of sensors on the circuit board of the probing machine require adjustment. For example, transmission type sensors need to be adjusted by turning the trimmers to control the light intensity. A sensor for wafer position detection needs to be adjusted so that vacuum chucking tweezers 21 can be inserted securely between wafers 20 when the wafer cassette is brought to the level of tweezers 21. For a photo interrupter for example, the shutter position needs to be adjusted. Other required maintenance operations include adjustment of a sensor to detect the eccentricity of wafer 20 at pre-alignment stage 25, greasing of the moving parts, adjustment of the transfer belt tension and correction of the standing parts.

For test stage unit 40a and 40b, the required maintenance operations are the adjustment of the position sensor for handling arm 27 and the greasing of the moving parts.

When it is necessary to do the above-mentioned maintenance operations, pull out loading/unloading unit 11 by executing the following procedure.

Remove bolts 67 and dismount fixed plate 65 at the front side from stationary base 51. Then, draw out loading/unloading unit 11 in the arrow direction A in FIG. 1. Movable base 52 having the main parts of unit 11 mounted fixedly thereto can be easily moved by the action of slide rail 60 which is provided between movable base 52 and stationary base 51 fixed to outside support frame 51.

When movable base 52 is drawn out on the front side, movable-side plates 61 fixed to movable base 52 move through balls 64 with respect to middle plates 63 and middle plates 63 move through balls 64 with respect to stationary-side plates 62 fixed to outside support frame 50.

As all those parts move through balls 64, heavy movable base 52 on which most parts of unit 11 are mounted can be moved smoothly.

According to the above embodiment, since slide rails 60 have middle plates 63, a moving stroke which is longer than the entire length of slide rails 60 can be obtained. Therefore, according to the above embodiment, loading/unloading unit 11 can be drawn out on the front side with a moving stroke of about 740 mm.

In addition, according to the above embodiment, caster 68, provided on the front side of movable base 52, bears a part of the weight of unit 11. This prevents unit 11 from overhanging and also prevents an excessive bending moment from being applied to rails 60.

By drawing out loading/unloading unit 11 on the front side, wide working space can be obtained on both sides of unit 11. Wide working space can also be provided between test stage units 40a and 40b. Therefore, it is possible to sufficiently maintain every corner of units 11, 40a and 40b.

The above embodiment has been described by taking a one-loader, two-stage type probing machine as an example. However, this invention is not limited to the above embodiment but may be applied to one-loader, one-stage type probing machines and one-loader, multistage type probing machines.

Though the described probing machine was for wafers, this invention is not limited to wafer probing machine but may be applied to LCD probing machines for testing LCDs.

A combined mechanism of ball guides and guide rails was adopted for the moving mechanism of the loading-/unloading unit. However, this invention is not limited to this mechanism but other types of moving mechanism such as roller guides and linear guides may be adopted.

The effects of this invention will be described in general terms. According to this invention, it is possible to disengage the loading/unloading unit from the test stage unit and consequently provide a sufficiently large space between the connecting parts of the two units. This makes it possible to sufficiently maintain the mechanisms existing at the connected part of the two units. Time required for maintenance of the machine can thus be reduced significantly. It is also possible to substantially eliminate the parts that preclude maintenance and sufficiently maintain every corner of the machine.

What is claimed is:
1. An electric probing test machine comprising:
   a pair of test stage units constructed as independent components of respective systems and used for testing the electrical characteristics of wafers under test while the wafers are mounted on said test stage units; and a loading/unloading unit constructed as an independent component of one system and used to load the wafers from a cassette and to unload the tested wafers one by one from one of said test stage units, said loading/unloading unit being combined with a side section of said one of said test stage units and disposed between said test stage units of said two systems, and said loading/unloading unit further comprising, means for separating and moving said loading/unloading unit away from said one of said test stage units, and means for pre-aligning wafers before the wafers are transferred from said wafer cassette to said one test stage unit.

2. The electric probing test machine according to claim 1, wherein said test stage unit is capable of a probing test of semiconductor wafers and comprises handling arms capable of bringing a semiconductor wafer to and from the stage of said test stage unit.

3. The electric probing test machine according to claim 1, wherein said means for separating and moving comprises:

means for sliding said loading/unloading unit away from said test stage unit, comprising ball guides, and rail members to guide the ball guides.

* * * * *